(12) United States Patent
Chen et al.

(10) Patent No.: US 7,676,014 B2
(45) Date of Patent: Mar. 9, 2010

(54) DIGITAL LOCK DETECTOR FOR PHASE-LOCKED LOOP

(75) Inventors: Yongcong Chen, Taipei (TW); Raymond Xu, Taipei (TW); Zhen-Yu Song, Beijing (TW); Ken-Ming Li, Taipei (TW)

(73) Assignee: Via Technologies, Inc., Taipei (TW)

( * ) Notice: Subject to any disclaimer, the term of this patent is extended or adjusted under 35 U.S.C. 154(b) by 857 days.

(21) Appl. No.: 11/423,976

(22) Filed: Jun. 14, 2006

(65) Prior Publication Data

US 2006/0280276 A1 Dec. 14, 2006

(30) Foreign Application Priority Data

Jun. 14, 2005 (TW) ................ 94119621 A

(51) Int. Cl.
H03D 3/24 (2006.01)
H03L 7/06 (2006.01)
H03L 7/095 (2006.01)

(52) U.S. Cl. .............. 375/376; 375/373; 327/147; 327/146

(58) Field of Classification Search ............ 375/371, 375/373, 376; 327/147, 150, 156, 159, 162, 327/163, 1, 2, 3; 331/1 A, 18, 25
See application file for complete search history.

(56) References Cited

U.S. PATENT DOCUMENTS 5,483,558 A * 1/1996 Leon et al. .............. 375/376
6,765,444 B2 * 7/2004 Wang et al. ............. 331/25
6,879,195 B2 * 4/2005 Green et al. ............ 327/147
7,480,361 B1 * 1/2009 Zhang et al. ............ 375/376
2006/0226914 A1 * 10/2006 Saado .................. 331/1 A

FOREIGN PATENT DOCUMENTS

CN 1380749 11/2002
TW 591896 6/2004

OTHER PUBLICATIONS

Taiwan Office Action mailed Sep. 20, 2006.
CN office action mailed Aug. 3, 2007.

* cited by examiner

*Primary Examiner*—Betsy L Deppe
(74) *Attorney, Agent, or Firm*—Thomas, Kayden, Horstemeyer & Risley

(57) ABSTRACT

A digital lock detector for a phase-locked loop. The PLL generates a feedback clock according to a reference clock. The digital lock detector includes a match detector and an arbiter. When a first clock transitions, the match detector checks that whether a second clock transitions in a predetermined time window or not. The match detector generates a match signal if the second clock transitions in the predetermined time window. The arbiter counts a number of the successive match signals and generates a lock signal to indicate a lock state when the number exceeds a first predetermined number.

10 Claims, 10 Drawing Sheets

DIGITAL LOCK DETECTOR FOR PHASE-LOCKED LOOP

BACKGROUND

1. Field of the Invention

The invention relates to a digital lock detector and, in particular, to a digital lock detector for a phase locked-loop (PLL).

2. Description of the Related Art

Clock generator is of great importance in modern synchronous systems, such as computer systems and communication equipments. Performance requirements of clock generators become more stringent with increasing operating speed of circuits. It is important to make sure that clocks are ready for logic operation. This function is known as lock detection and typically performed by a lock detector. In general, a lock detector is applied in frequency synthesizers or clock and data recovery (CDR) where using phase locked-loop. The PLL compares input reference clock with feedback clock that comes from a voltage controlled oscillator (VCO). Usually, there is a variable divider between VCO and feedback clock. Once VCO's frequency enters a predetermined lock-in range, the lock detector generates a "lock" signal to indicate PLL entering a "lock" state. While VCO's frequency satisfies a predetermined lock-out criterion, lock detector generates an "unlock" signal to indicate PLL entering an "unlock" state. "Lock" and "unlock" signals of PLL are important to frequency synthesizers or clock and data recovery for accurately controlling operations of PLL.

There are several lock detectors for PLL application. One of lock detector is frequency-to-voltage (F-V) converter. One F/V converter usually uses capacitors and resistors that could vary as much as ±10%~20% due to process, temperature and bias voltage. Therefore, a precise lock indication is difficult to be obtained through this structure. Another method is to convert difference of UP and DOWN pulse of phase frequency detector (PFD) output to a voltage.

Some conventional lock detectors are implemented with analog circuits, which include resistors and capacitors susceptible to variations of process, temperature and power supply voltage, rendering the analog lock detectors unstable. As a result, digital lock detectors become a common solution to such problems.

SUMMARY

An embodiment of a lock detector for a phase-locked loop includes a match detector and an arbiter. When a first clock transitions, the match detector checks that whether a second clock transitions in a predetermined time window or not. The match detector generates a match signal if the second clock transitions in the predetermined time window. The arbiter counts a number of the successive match signals and generates a lock signal to indicate a lock state when the number exceeds a first predetermined number.

An embodiment of a lock detector for a phase-locked loop includes a match detector and an arbiter. The match detector generates an un-match signal if the second clock transitions outside the predetermined time window. The arbiter counts a number of the successive un-match signals and generates an unlock signal to indicate an unlock state when the number exceeds a second predetermined number.

An embodiment of a lock detector for a phase-locked loop includes a match detector and an arbiter. The match detector includes a lead sampler, a lag sampler, and a judge controller. The lead sampler samples a lead logic state of the second clock at a predetermined lead time earlier than the transition of the first clock. The lag sampler samples a lag logic state of the second clock at a predetermined lag time later than the transition of the first clock. The judge controller judges whether the second clock transitions in the predetermined time window according to the lead and lag logic states.

The invention constructs a predetermined time window with a lead clock and a lag clock. When the second clock successively transitions in the predetermined time window for N times, a match detector generates a match signal to indicate a lock state. When the second clock successively transitions outside the time window for M times, the match detector generates an unlock signal to indicated an unlock state. The invention provides a digital lock detector such that a lock precision is improved and circuitry area is saved.

DETAILED DESCRIPTION

Figure 1:
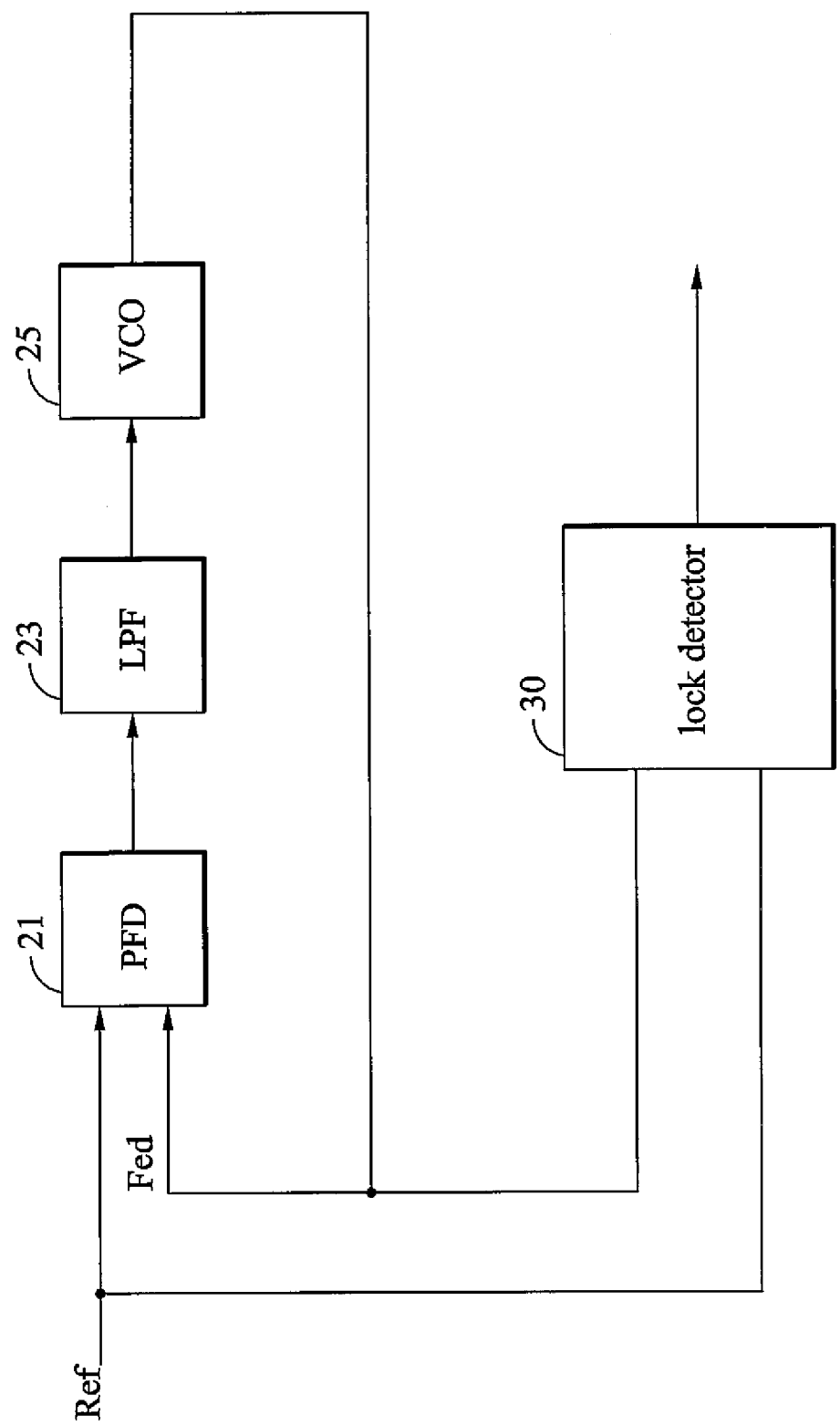
FIG. 1 is a block diagram of a phase locked-loop with a digital lock detector according to an embodiment of the invention.

FIG. 1 is a block diagram of a phase locked-loop with a digital lock detector according to an embodiment of the invention. The phase locked-loop includes a phase frequency detector 21, a low pass filter 23, a voltage controlled oscillator 25 and a digital lock detector 30. A loop formed by the phase frequency detector 21, the low pass filter 23, and the voltage controlled oscillator 25 receives a reference clock Ref and generates a feedback clock Fed. The digital lock detector 30 detects whether the phase locked-loop is in a lock state and generates a lock signal to indicate the feedback clock Fed enter a lock state.

Figure 2A:
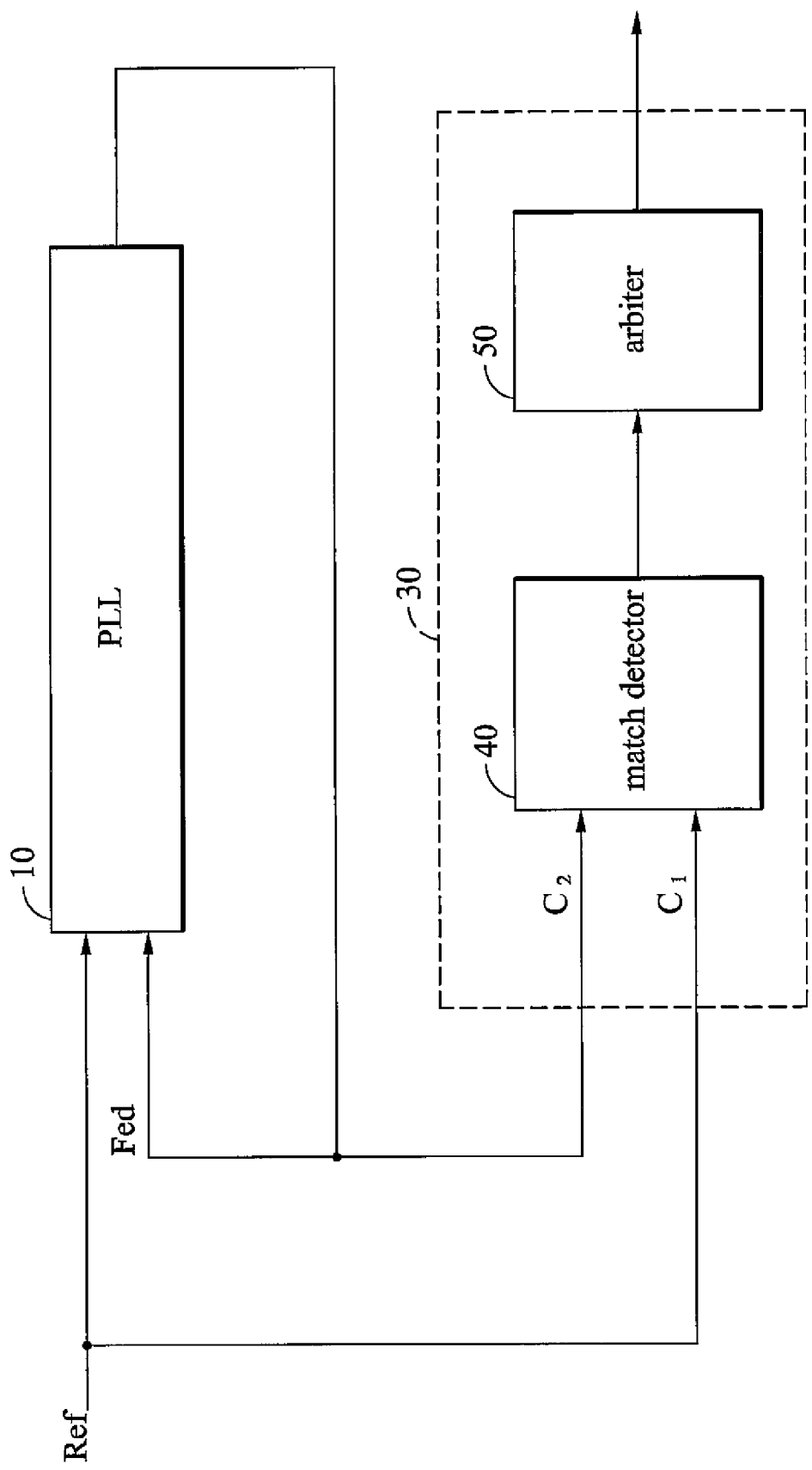
FIG. 2A is a block diagram of a phase locked-loop with a digital lock detector according to an embodiment of the invention.
Figure 2B:
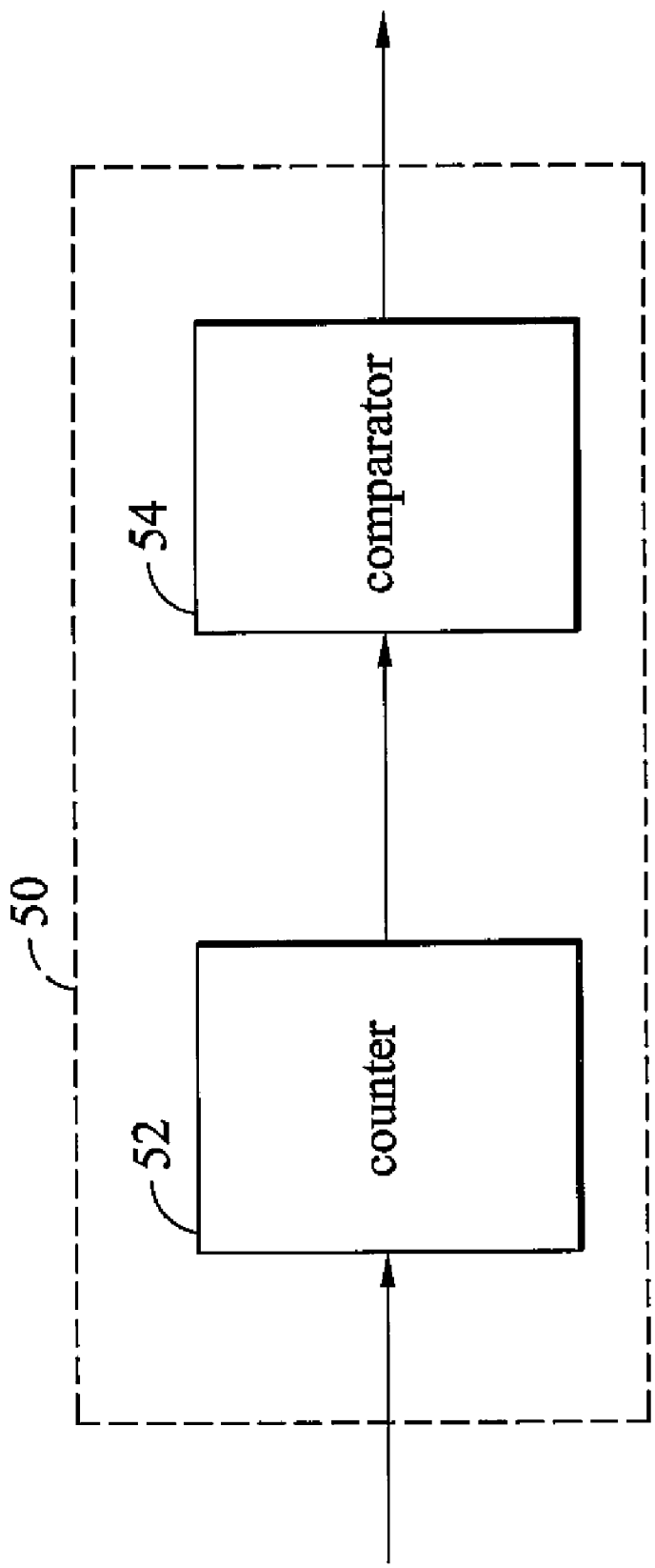
FIG. 2B shows an embodiment of the arbiter in FIG. 2A.

FIG. 2A is a block diagram of a phase locked-loop with a digital lock detector according to an embodiment of the invention. The phase locked-loop 10 generates a feedback clock Fed according to a reference clock Ref. The digital lock detector includes a match detector 40 and an arbiter 50. The match detector 40 detects whether a second clock $C_2$ transitions in a predetermined time window when a first clock $C_1$ transitions. The predetermined time window includes a transition point of the first clock $C_1$. When the second clock $C_2$ transitions in a predetermined time window, it indicates the second clock $C_2$ and the first clock $C_1$ transition substantially at the same time and the match detector 40 generates a match signal. When the second clock $C_2$ does not transition in the predetermined time window, the match detector 40 generates an un-match signal. An embodiment of the arbiter 50 is shown in FIG. 2B. The arbiter 50 includes a counter 52 and a comparator 54. The counter 52 counts a number of the successive match signals. The comparator 54 generates a lock signal to indicate a lock state of the feedback clock Fed when the number exceeds a predetermined number N. In addition, the counter 52 can also count a number of the successive un-match signals. The comparator 54 generates an unlock signal to indicate an unlock state of the feedback clock Fed when the number exceeds a predetermined number M. In FIG. 2A, the first clock $C_1$ is the reference clock Ref and the second clock $C_2$ is the feedback clock Fed. In actual application, the first clock $C_1$ can be the feedback clock Fed and the second clock $C_2$ can be the reference clock Ref.

Figure 3:
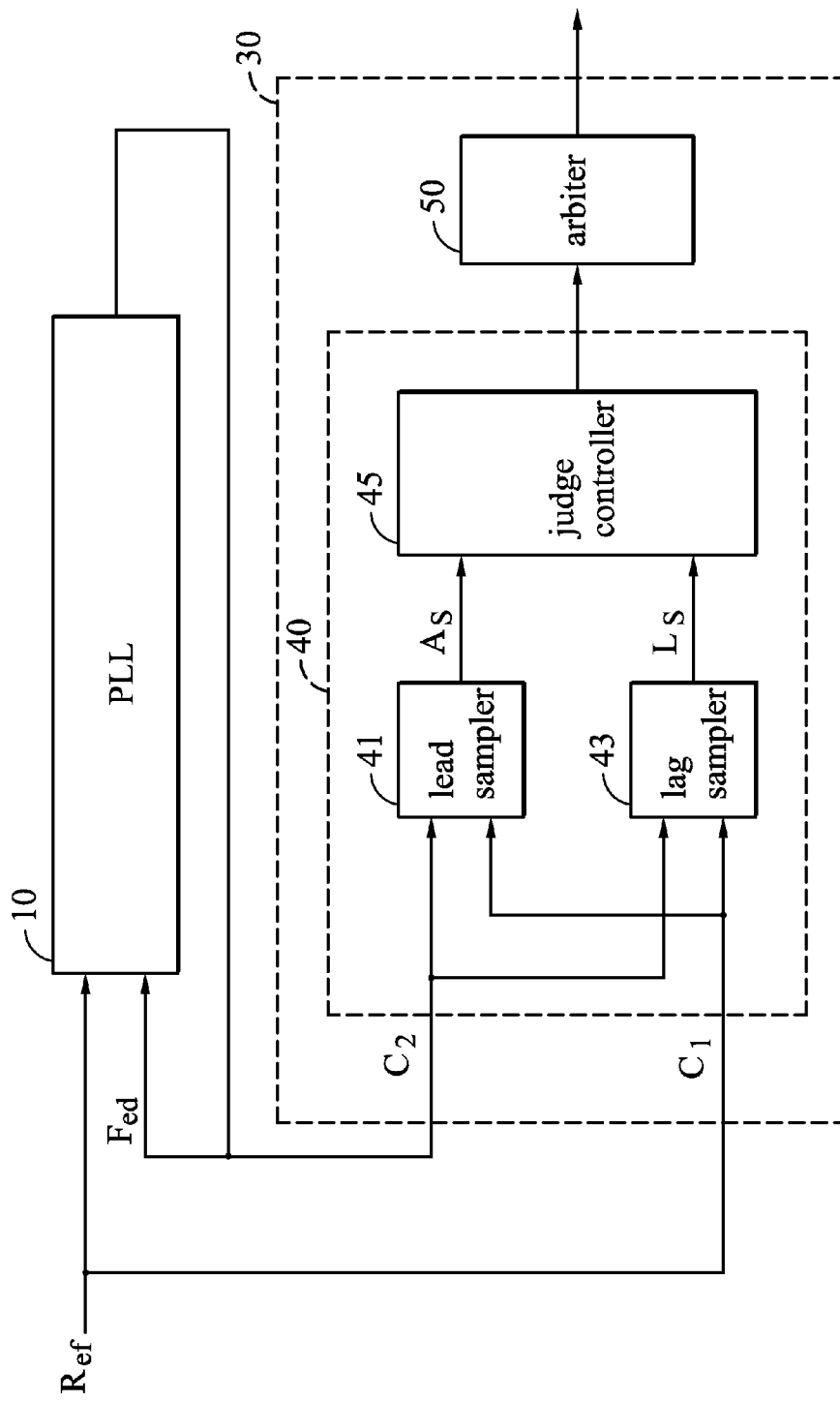
FIG. 3 is a block diagram of a phase locked-loop with a digital lock detector according to another embodiment of the invention.

FIG. 3 is a block diagram of a phase locked-loop with a digital lock detector according to another embodiment of the invention. The digital lock detector includes a match detector 40 and an arbiter 50. The match detector includes a lead sampler 41, a lag sampler 43, and a judge controller 45. The lead sampler 41 samples a lead logic state $A_s$ of the second clock $C_2$ at a predetermined lead time earlier than a transition of the first clock $C_1$. The lag sampler 43 samples a lag logic state $L_s$ of the second clock $C_2$ at a predetermined lag time later than the transition of the first clock $C_1$. The lead and lag logic states $A_s$ and $L_s$ are respectively transmitted to inputs of the judge controller 45. The judge controller 45 receives the lead and lag logic states $A_s$ and $L_s$ and judges whether the second clock $C_2$ transitions in the predetermined time window according to the lead and lag logic states $A_s$ and $L_s$. When the second clock $C_2$ transitions in a predetermined time window, the judge controller 45 generates a match signal. The arbiter 50 counts a number of the successive match signals and determines whether to generate a lock signal. When the second clock $C_2$ does not transition in the predetermined time window, the judge controller 45 generates a un-match signal. The arbiter 50 counts a number of the successive un-match signals and determines whether to generate an unlock signal.

Figure 4A:
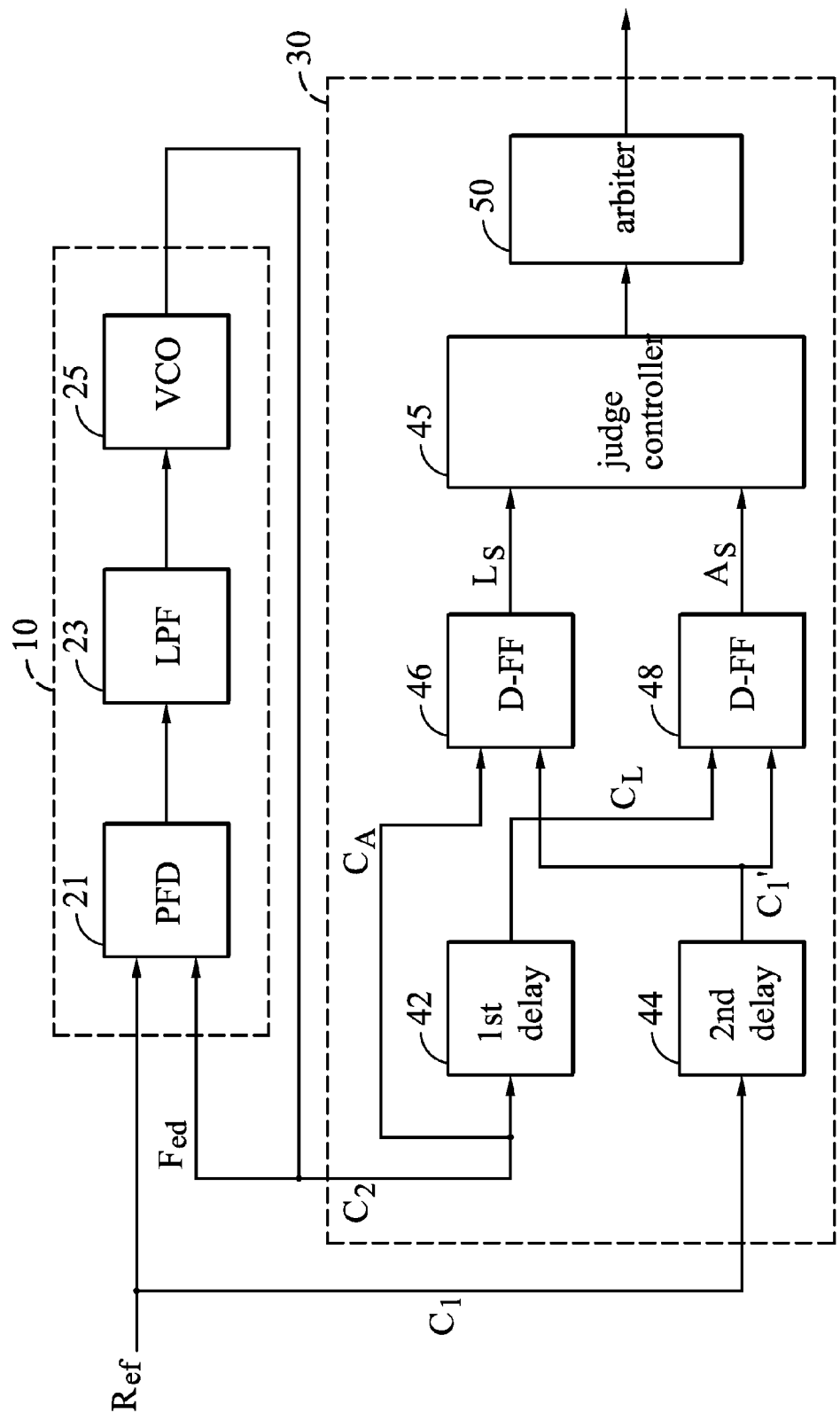
FIG. 4A is a block diagram of a phase locked-loop with a digital lock detector according to another embodiment of the invention.
Figure 4B:
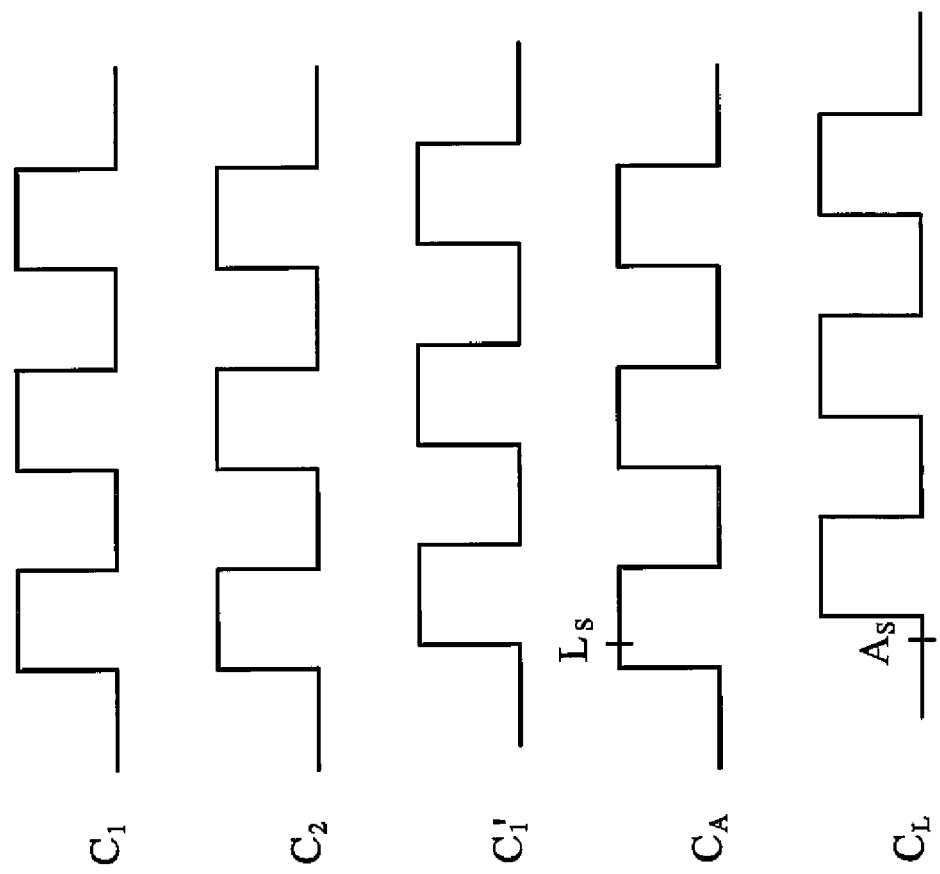
FIG. 4B is a timing diagram of each clock in the phase locked-loop in FIG. 4A.
Figure 4D:
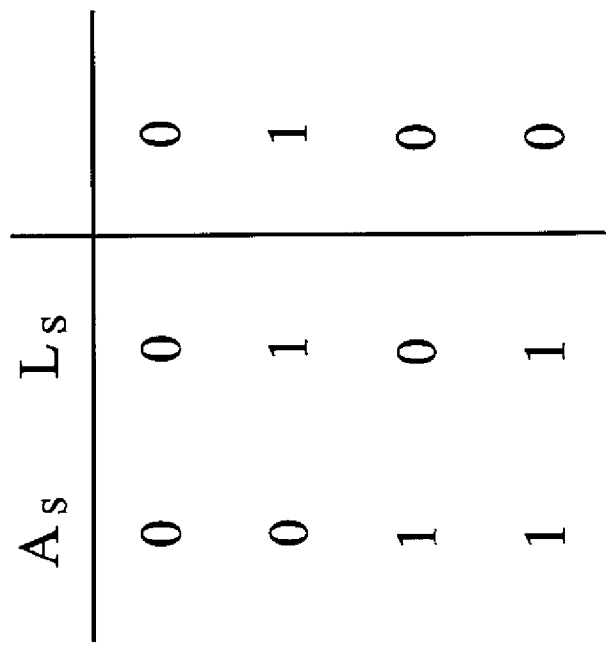
FIG. 4D shows a truth table of the judge controller in FIG. 4C.
Figure 4C:
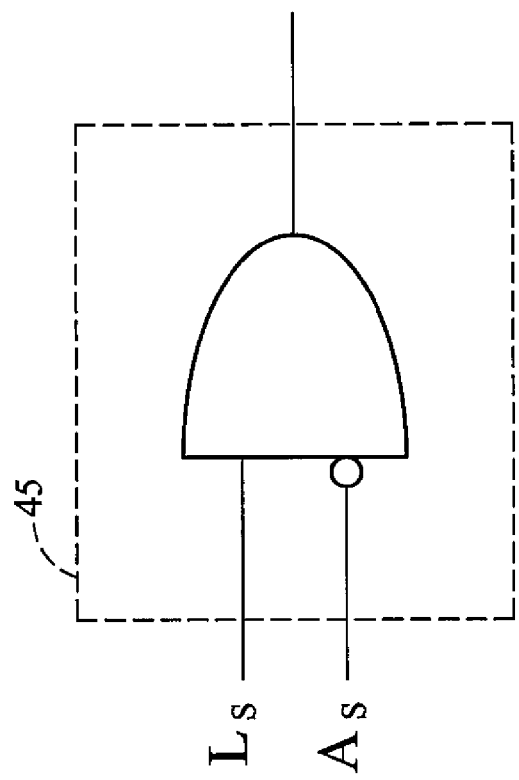
FIG. 4C is a schematic diagram of a logic gate of the judge controller in FIG. 4A.

FIG. 4A is a block diagram of a phase locked-loop with a digital lock detector according to another embodiment of the invention. The lock detector 30 further includes a first delay 42 and a second delay 44. The second clock $C_2$ is a lead clock $C_A$. The first delay 42 delays the lead clock $C_A$ by a first delay time to generate a lag clock $C_L$. The second delay 44 delays the first clock $C_1$ by a second delay time to generate a first delayed clock $C_1'$. Preferably the first delay time is longer than the second delay time. Alternatively, the first delay 42 can be divided into several delays and makes a total delay time thereof longer than the second delay time. The first D flip-flop 46 receives the lead clock $C_A$ and uses the first delayed clock $C_1'$ as a sampling clock thereof. The first D flip-flop 46 samples a lag logic state $L_s$ of the second clock $C_2$ at a predetermined lag time later than the transition of the first clock $C_1$. The second D flip-flop 48 receives the lag clock $C_L$ and uses the first delayed clock $C_1'$ as a sampling clock thereof. The second D flip-flop 48 samples a lead logic state $A_s$ of the second clock $C_2$ at a predetermined lead time earlier than the transition of the first clock $C_1$. FIG. 4B is a timing diagram of each clock in the phase locked-loop. The sampling clock $C_1'$ can be used to equivalently sample the lag state $L_s$ of the second clock $C_2$ from a lead clock $C_A$. Similarly, the sampling clock $C_1'$ can be used to equivalently sample the lead state $A_s$ of the second clock $C_2$ from a lag clock $C_L$. More specifically, the first delay time is a sum of the predetermined lead time and the predetermined lag time, and the second delay time is the predetermined lag time. FIG. 4C is a schematic diagram of a logic gate of the judge controller 45. The lead and lag logic states are input signals of the judge controller 45 and a truth table thereof is shown in FIG. 4D. When the lead state $A_s$ and the lag state $L_s$ are respectively 0 and 1, the judge controller generates a match signal of logic state "1" to indicate that the second clock $C_2$ transitions in the predetermined time window. The arbiter 50 counts a number of the successive match signals of logic state "1" and determines whether to generate a lock signal. When the second clock $C_2$ does not transition in the predetermined time window, the judge controller 45 generates an un-match signal of logic state "0". The arbiter 50 counts a number of the successive un-match signals and determines whether to generate a unlock signal. It is emphasized that the schematic diagram of the judge controller 45 and the truth table thereof are just an example for explanation. The scope of the invention is not limited thereto. The judge controller 45 can be implemented by combinations of digital logic circuits.

Figure 5A:
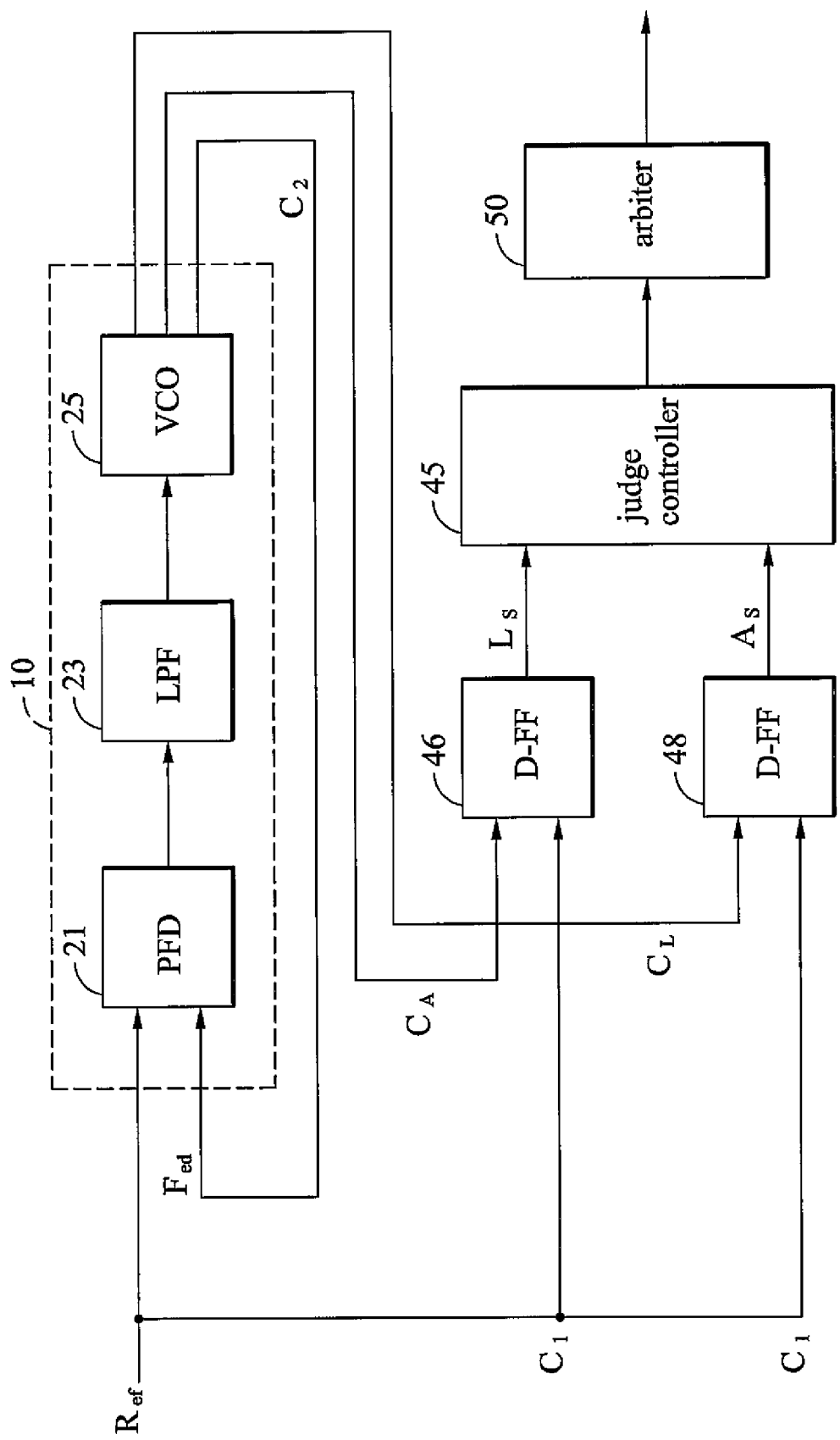
FIG. 5A is a block diagram of a phased locked-loop with a digital lock detector according to another embodiment of the invention.
Figure 5B:
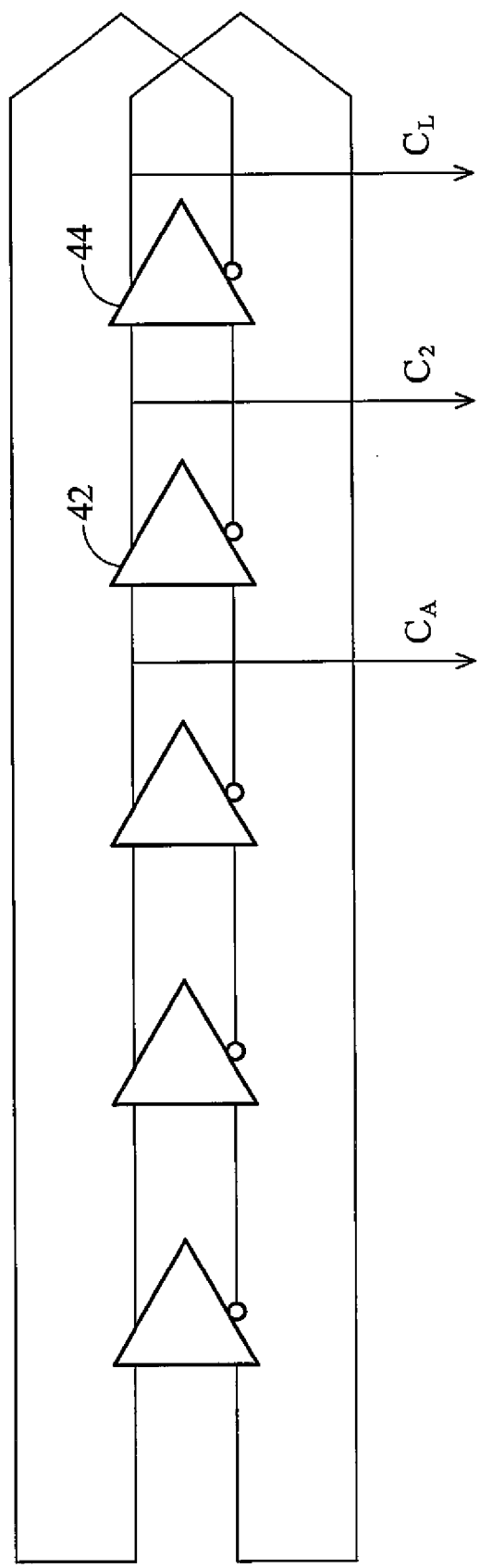
FIG. 5B shows an embodiment of the voltage controlled oscillator in FIG. 5A.

Although the first and second delays 42 and 44 are arranged out of the phase locked-loop 10, the first and second delays 42 and 44 can be arranged in the voltage controlled oscillator 25 of the phase locked-loop 10. FIG. 5A is a block diagram of a phased locked-loop with a digital lock detector according to another embodiment of the invention. The voltage controlled oscillator 25 of the phase locked-loop 10 generates a lead clock $C_A$, a second clock $C_2$, and a lag clock $C_L$. The first D flip-flop 46 receives the lead clock $C_A$ and uses the first clock $C_1$ as a sampling clock thereof. The first D flip-flop 46 samples a lag logic state $L_s$ of the second clock $C_2$ a predetermined lag time later than the transition of the first clock $C_1$. The second D flip-flop 48 receives the lag clock $C_L$ and uses the first clock $C_1$ as a sampling clock thereof. The second D flip-flop 48 samples a lead logic state $A_s$ of the second clock $C_2$ a predetermined lead time earlier than the transition of the first clock $C_1$. The judge controller 45 receives the lead and lag logic states $A_s$ and $L_s$ and judges whether the second clock $C_2$ transitions in the predetermined time window according to the lead and lag logic states $A_s$ and $L_s$. When the second clock $C_2$ transitions in a predetermined time window, the judge controller 45 generates a match signal. The arbiter 50 counts a number of the successive match signals and determines whether to generate a lock signal. When the second clock $C_2$ does not transition in the predetermined time window, the judge controller 45 generates an un-match signal. The arbiter 50 counts a number of the successive un-match signals and determines whether to generate a unlock signal. The voltage controlled oscillator 25 is a differential ring oscillator, as shown in FIG. 5B. Since there is a delay time for each differential stage, the differential stages can be the delay 42 and 44. As a result, the lead clock $C_A$ is a first delay time earlier than the second clock $C_2$ and the lag clock $C_L$ is a second delay time later than the second clock $C_2$. Thus, a time window can be formed. Apparently, a width of the time window changes with operating frequency of the voltage controlled oscillator. A higher clock frequency results in a tighter time window and a lower clock frequency results in a looser time window.

Figure 6:
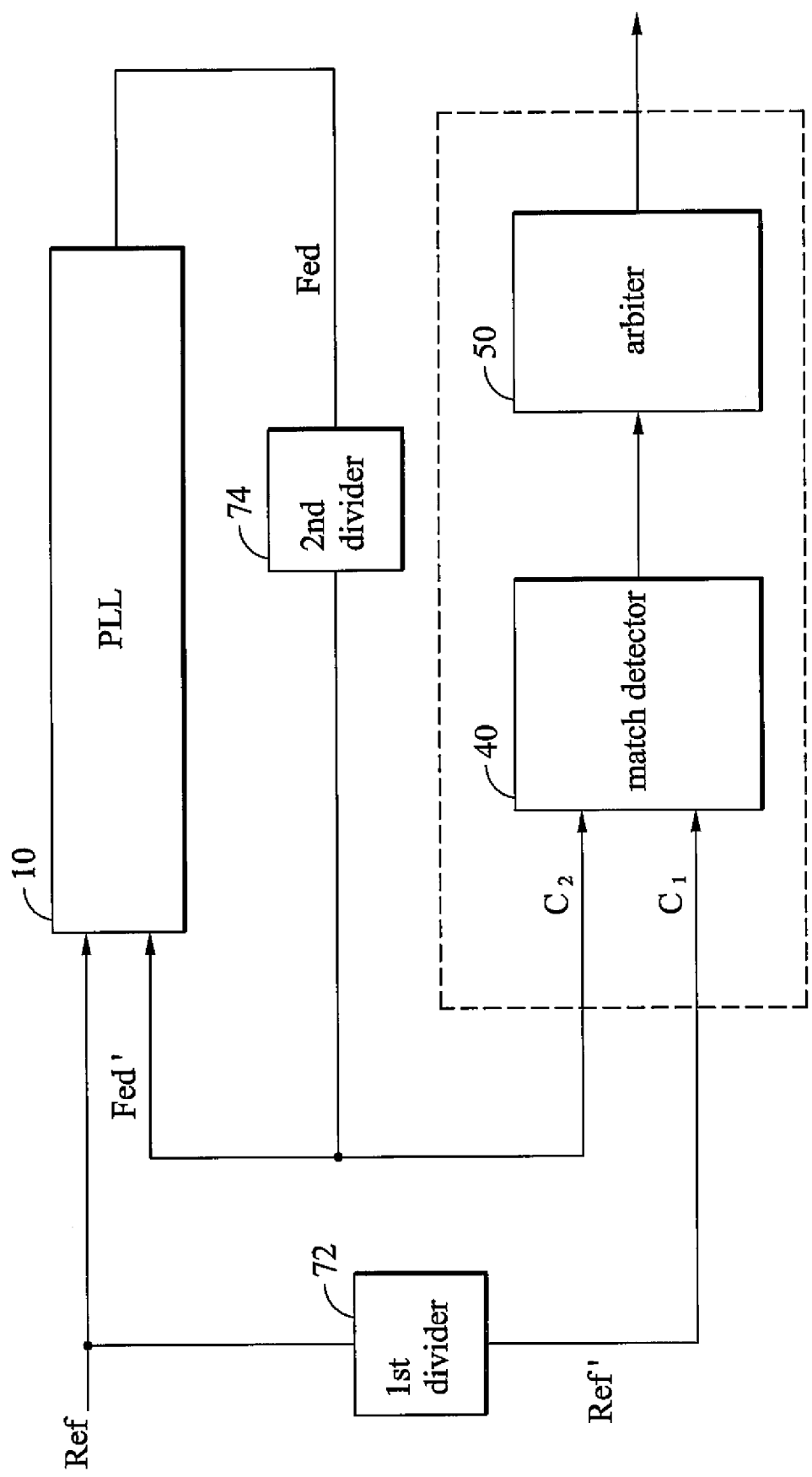
FIG. 6 is a block diagram of a phased locked-loop with a digital lock detector according to another embodiment of the invention.

FIG. 6 is a block diagram of a phased locked-loop with a digital lock detector according to another embodiment of the invention. As shown in FIG. 6, the lock detector 30 further includes a first divider 72 and a second divider 74. The first divider 72 down-converts the reference clock Ref to a down-converted reference clock Ref'. The second divider 74 down-converts the feedback clock Fed to a down-converted feedback clock Fed'. In FIG. 6, the first clock $C_1$ is the down-converted reference clock Ref' and the second clock $C_2$ is the down-converted feedback clock Fed'. Alternatively, the first clock $C_1$ can be the down-converted feedback clock Fed' and the second clock $C_2$ can be the down-converted reference clock Ref'.

The invention constructs a predetermined time window with a lead clock and a lag clock of a second clock. When the second clock successively transitions in the predetermined time window for N times (a first predetermined number), a match detector generates a match signal to indicate a lock state. When the second clock successively transitions outside the time window for M times (a second predetermined number), the match detector generates an unlock signal to indicated an unlock state. The invention provides a digital lock detector such that a lock precision is improved and circuitry area is saved. Moreover, a mis-lock can be avoided.

While the invention has been described by way of example and in terms of preferred embodiment, it is to be understood that the invention is not limited thereto. To the contrary, it is intended to cover various modifications and would be apparent to those skilled in the art. Therefore, the scope of the appended claims should be accorded with the broadest interpretation so as to encompass all such modifications.,

What is claimed is:

1. A digital lock detector for a phase-locked loop(PLL), the PLL generating a feedback clock according to a reference clock, the digital lock detector comprising:
    a match detector, checking whether a second clock transitions in a predetermined time window when a first clock transitions and generating a match signal if the second clock transitions in the predetermined time window, wherein the match detector comprises:
        a lead sampler, sampling a lead logic state of the second clock at a predetermined lead time earlier than the transition of the first clock;
        a lag sampler, sampling a lag logic state of the second clock at a predetermined lag time later than the transition of the first clock; and
        a judge controller, judging whether the second clock transitions in the predetermined time window according to the lead and lag logic states;
    an arbiter, counting a number of the successive match signals and generating a lock signal to indicate a lock state when the number exceeds a first predetermined number;
    wherein the first clock transitions in the predetermined time window, the first clock corresponds to one of the reference clock and the feedback clock, and the second clock corresponds to the other of the reference clock and the feedback clock.

2. The digital lock detector of claim 1, wherein the arbiter comprises:
    a counter, counting the number of the successive match signals; and
    a comparator, generating the lock signal to indicate the lock state when the number of the successive match signals exceeds the first predetermined number.

3. The digital lock detector of claim 1, wherein the match detector generates a un-match signal if the second clock does not transition in the predetermined time window and the arbiter counts a number of the successive un-match signals and generates an unlock signal to indicate an unlock state when the number exceeds a second predetermined number.

4. The digital lock detector of claim 3, wherein the arbiter comprises:
    a counter, counting the number of the successive un-match signals; and
    a comparator, generating an unlock signal to indicate an unlock state when the number of the successive un-match signals exceeds the second predetermined number.

5. The digital lock detector of claim 1, wherein the first clock is the reference clock and the second clock is the feedback clock.

6. A digital lock detector for a phase-locked loop(PLL), the PLL generating a feedback clock according to a reference clock, the digital lock detector comprising:
    a match detector, checking whether a second clock transitions in a predetermined time window when a first clock transitions and generating a match signal if the second clock transitions in the predetermined time window, wherein the match detector comprises:
        a first delay, delaying the second clock by a first delay time to generate a lag clock;
        a second delay, delaying the first clock by a second delay time to generate a first delayed clock, wherein the first delay time is longer than the second delay time;
        a first sampler sampling a first logic state of the second clock to provide a lag logic state when the first delayed clock transitions;
        a second sampler sampling a second logic state of the lag clock to provide a lead logic state when the first delayed clock transitions; and
        a judge controller, judging whether the second clock transitions in the predetermined time window accord mg to the lead and lag logic states;
    an arbiter, counting a number of the successive match signals and generating a lock signal to indicate a lock state when the number exceeds a first predetermined number;
    wherein the first clock transitions in the predetermined time window, the first clock corresponds to one of the reference clock and the feedback clock, and the second clock corresponds to the other of the reference clock and the feedback clock.

7. The digital lock detector of claim 6, wherein the first delay time is a sum of the predetermined lead time and the predetermined lag time, and the second delay time is the predetermined lead time.

8. The digital lock detector of claim 6, wherein the first sampler is a first D flip-flop receiving the second clock, and the second sampler is a second D flip-flop receiving the lag clock, wherein the first delayed clock is regarded as a sampling clock of the first and second D flip-flops.

9. The digital lock detector of claim 6, wherein the first clock is the reference clock, the second clock is the feedback clock, and the first and second delays are in a voltage controlled oscillator of the digital lock detector.

10. The digital lock detector of claim 6, wherein the first clock is the reference clock and the second clock is the feedback clock.

* * * * *